United States Patent
Yang et al.

(10) Patent No.: US 8,188,550 B2
(45) Date of Patent: May 29, 2012

(54) INTEGRATED CIRCUIT STRUCTURE WITH ELECTRICAL STRAP AND ITS METHOD OF FORMING

(75) Inventors: Lieyong Yang, Singapore (SG); Siau Ben Chiah, Singapore (SG); Ming Lei, Singapore (SG); Hua Xiao, Singapore (SG); Xiongfei Yu, Singapore (SG); Kelvin Tianpeng Guan, Singapore (SG); Puay San Chia, Singapore (SG); Chor Shu Cheng, Singapore (SG); Gary Chia, Singapore (SG); Chee Kong Leong, Singapore (SG); Sean Lian, Berne, NY (US); Kin San Pey, Singapore (SG); Chao Yong Li, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 441 days.

(21) Appl. No.: 12/241,105

(22) Filed: Sep. 30, 2008

(65) Prior Publication Data

US 2009/0166758 A1    Jul. 2, 2009

Related U.S. Application Data

(60) Provisional application No. 61/017,156, filed on Dec. 27, 2007.

(51) Int. Cl.
*H01L 27/088* (2006.01)
*H01L 21/70* (2006.01)
*H01L 21/44* (2006.01)

(52) U.S. Cl. ............... 257/399; 257/369; 257/E27.098; 257/E21.661; 438/599

(58) Field of Classification Search ................... 257/393, 257/E27.101; 438/599
See application file for complete search history.

(56) References Cited

U.S. PATENT DOCUMENTS

| | | | |
|---|---|---|---|
| 4,804,636 A * | 2/1989 | Groover et al. | 438/275 |
| 5,541,427 A * | 7/1996 | Chappell et al. | 257/306 |
| 5,573,980 A | 11/1996 | Yoo | |
| 5,621,232 A * | 4/1997 | Ohno | 257/288 |
| 5,741,735 A * | 4/1998 | Violette et al. | 438/279 |
| 6,289,412 B1 * | 9/2001 | Yuan et al. | 703/14 |
| 6,429,124 B1 * | 8/2002 | Tang et al. | 438/643 |
| 6,680,233 B2 * | 1/2004 | Yu et al. | 438/303 |
| 6,765,269 B2 * | 7/2004 | Lee et al. | 257/383 |
| 6,777,734 B2 | 8/2004 | Min | |
| 2004/0150051 A1 | 8/2004 | Kim et al. | |
| 2004/0264274 A1 | 12/2004 | Ikeda et al. | |
| 2005/0082622 A1 | 4/2005 | Ikeda et al. | |
| 2005/0179094 A1 | 8/2005 | Kim et al. | |
| 2005/0212054 A1 | 9/2005 | Hashimoto | |
| 2006/0120143 A1 | 6/2006 | Liaw | |
| 2007/0007566 A1 | 1/2007 | Ishimaru | |
| 2007/0090428 A1 | 4/2007 | Liaw | |
| 2008/0303105 A1 * | 12/2008 | Chang et al. | 257/412 |

* cited by examiner

*Primary Examiner* — Nathan Ha
*Assistant Examiner* — Michael Jung
(74) *Attorney, Agent, or Firm* — Horizon IP Pte Ltd

(57) ABSTRACT

A method of forming an IC is presented. The method includes providing a substrate having a plurality of transistors formed thereon. The transistors have gate stack, source and drain regions. An electrical strap is formed and in contact with at least a portion of at least one sidewall of the gate stack of a first transistor to provide a continuous electrical flowpath over a gate electrode of the first transistor and the source or drain region of a second transistor.

21 Claims, 15 Drawing Sheets

INTEGRATED CIRCUIT STRUCTURE WITH ELECTRICAL STRAP AND ITS METHOD OF FORMING

BACKGROUND

It is desirable to reduce the size of known SRAM cells in order to reduce the overall size of integrated circuits and to improve circuit performance.

FIG. 1 is a schematic illustration of a prior art SRAM cell 10 having a contact bar providing an electrical strap 12 between the polycrystalline gates of two transistor devices (M1, M2) and the drain of a further transistor device (M4). The contact bar allows a reduction in the SRAM cell size to be made.

However, the introduction of the contact bar presents a number of process-related issues including a smaller process window for contact etch and a more complex optical proximity correction (OPC) model for the lithography process.

This is at least in part because in order to form the contact bar, a trench must be formed through an interlayer dielectric (ILD) layer overlying the transistor devices. Once the trench has been formed, a conducting material is deposited in the trench to form the contact bar.

One of the problems associated with the fabrication of SRAM cells having such a contact bar is that of 'punch through' due to contact over etch. 'Punch through' due to contact over etch refers to the situation in which an etch step results in a portion of a layer being etched that should not have been etched.

FIG. 2 shows a cross-sectional schematic diagram of a structure 50 after an etch process has been performed to remove a portion of ILD layer 60 thereby to expose a gate contact element 54 and a drain contact element 56. The gate and drain contact elements 54, 56 are formed from a metal silicide. The ILD layer may be formed from tetraethyl orthosilicate (TEOS), borophosphosilicate glass (BPSG) or any other suitable ILD material.

As can be seen in FIG. 2, region 'A' (at the interface between the ILD layer 60 and a shallow trench isolation (STI) region 51) is not provided with metal silicide. Consequently, it is difficult to terminate the etch process in region A at the stage when both the gate contact element 54, the drain contact element 56 and the STI region 51 are exposed without etching at least a portion of STI region 58. In other words, it is difficult to avoid 'punch through' during the etching process, thereby resulting in etching of a portion of STI region 58. Punch through is undesirable since it can result in bitline failure.

In view of the foregoing, it is desirable to provide memory cells with improved circuit performance.

SUMMARY

A method of forming an IC is provided. The method includes providing a substrate having a plurality of transistors formed thereon, the transistors having gate stack, source and drain regions. An electrical strap is formed and in contact with at least a portion of at least one sidewall of the gate stack of a first transistor to provide a continuous electrical flowpath over a gate electrode of the first transistor and the source or drain region of a second transistor.

In another embodiment, the method further includes forming the electrical strap that comprises forming a first layer over and in contact with at least a portion of a spacer element of at least one sidewall of the gate stack of a first transistor. The first layer extends over the gate electrode of a first transistor and over the source or drain region of a second transistor device. The first layer is arranged to provide a continuous electrical flowpath over the spacer element between a gate electrode of the first transistor and the source or drain region of the second transistor.

An IC is disclosed in one embodiment. The IC includes a substrate having a plurality of transistors and an electrical strap. The electrical strap is over and in contact with at least a portion of at least one of a pair of opposed sidewalls of a gate stack of a first transistor. The electrical strap is arranged to provide a continuous electrical flowpath over the sidewall between a gate electrode of the first transistor and a source or drain region of a second transistor.

In another embodiment, a memory cell is provided. The memory cell includes a plurality of transistors interconnected to form the memory cell and at least one electrical strap. The electrical strap couples a first gate of a first transistor to a first source/drain diffusion region of the first transistor. The electrical strap contacts top and at least a sidewall of the first gate adjacent to the first source/drain diffusion region of the first transistor.

A memory cell layout is disclosed in one embodiment. The memory cell layout includes a substrate defined with first and second active regions. The layout includes a plurality of first transistors in the first active region and a plurality of second transistors in the second active region. The layout further includes at least one electrical strap. The electrical strap couples a gate of one of the first or second transistor to one of its source/drain diffusion region, wherein the electrical strap contacts top and at least a sidewall of the gate adjacent to the source/drain diffusion region to which the gate is coupled.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 3:
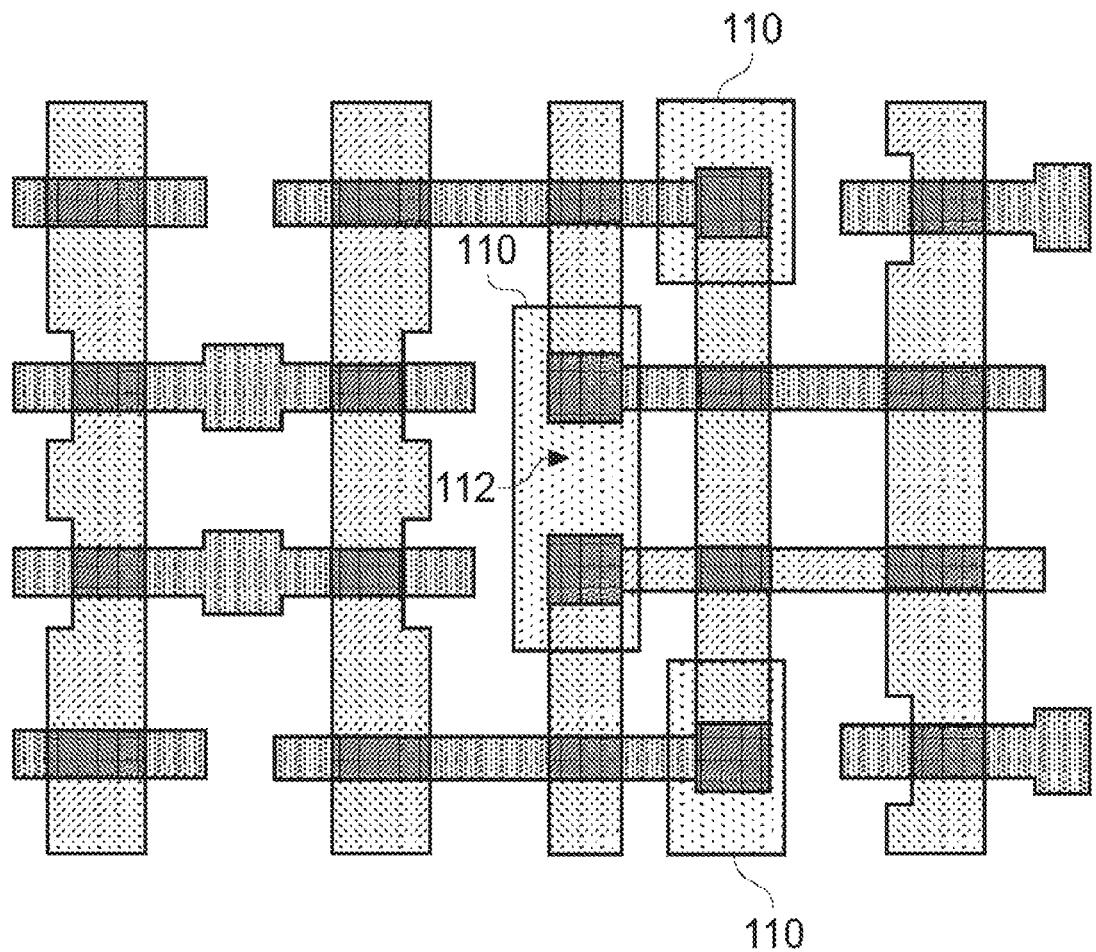
FIG. 3 is a schematic illustration of a portion of a SRAM cell showing the position of an opening formed in a resist layer prior to an etching process to remove sidewall spacer elements.

FIG. 3 is a schematic illustration of a portion of a SRAM cell. In the structure of FIG. 3, a layer of resist material has been applied to the surface of the structure and windows 110 formed in the layer of resist to expose regions 112 of the structure underlying the layer of resist material.

Figure 4:
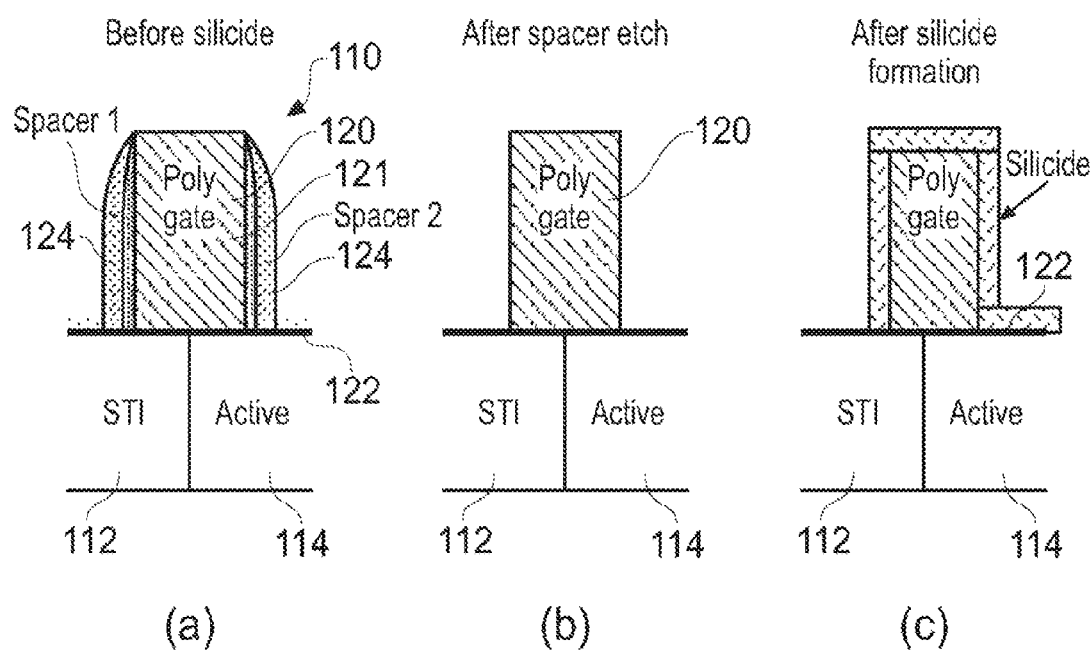
FIG. 4 is a schematic illustration of a structure (a) before removal of spacer elements; (b) after removal of the spacer elements; and (c) after formation of a silicide layer.

FIG. 4(a) is a cross-sectional schematic illustration of a portion of a region exposed by forming the window 110 in the resist.

It can be seen that the structure exposed has a gate stack 120. The gate stack 120 is formed over a portion of the substrate that comprises a shallow trench isolation region 112 and an active region 114. Spacer elements 124 are provided on sidewalls of the gate stack 120.

Figure 5:
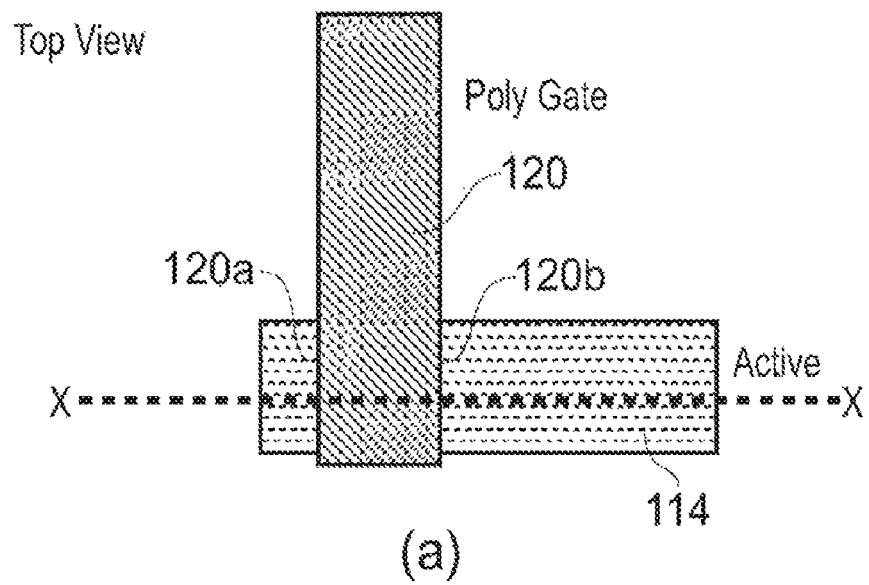
FIG. 5 is a schematic illustration of a structure formed during fabrication of a SRAM cell according to an embodiment of the invention showing (a) a plan view and (b) a cross-sectional view of the structure.
Figure 5:
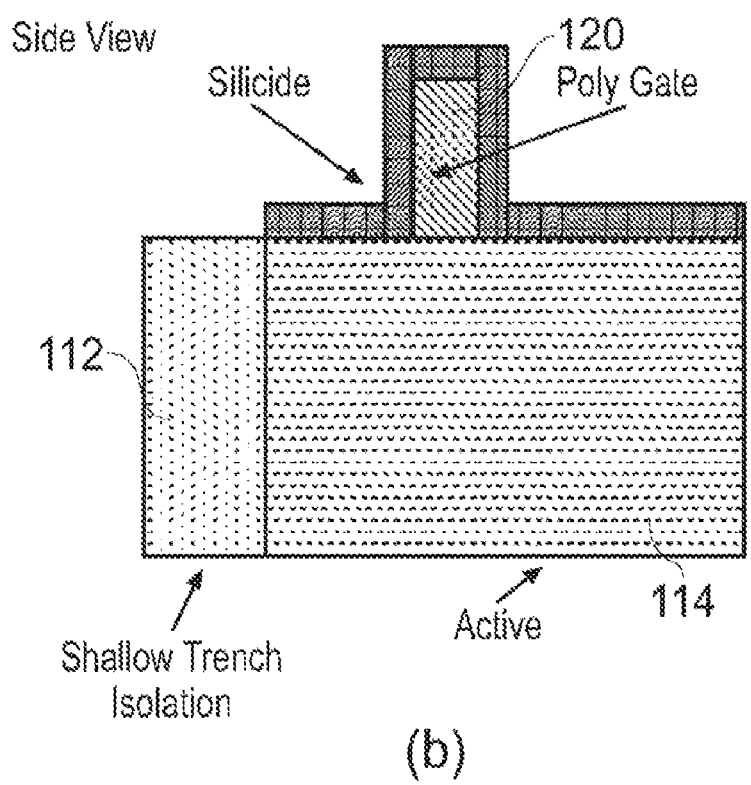

In some embodiments of the invention such as the embodiment shown in FIG. 5, the gate stack 120 is formed over a portion of the substrate that comprises an active region 114 only.

The gate stack 120 has a gate electrode 121. According to the first embodiment, the gate electrode is formed from polycrystalline silicon. Other materials are also useful for forming the gate electrode.

FIG. 4(b) shows the structure of FIG. 4(a) following a process of removing the spacer elements 124 from opposed sidewalls of the gate stack 120. Following the process of removal of the spacer elements 124, polycrystalline silicon sidewalls of the gate electrode 121 are exposed.

FIG. 4(c) shows the structure of FIG. 4(b) following a process of forming a layer of metal silicide over the gate stack 120 and drain region 122. Metal silicide is formed by coating the gate stack 120 and drain region 122 with metal, followed by the step of heating the structure to form metal silicide.

In one embodiment the metal is cobalt and the metal silicide is cobalt disilicide. Other metals are also useful. Other silicides are also useful. For example, in some embodiments, deposition of nickel followed by heating to form nickel silicide (NiSi) is also useful.

FIG. 5(a) shows a plan view, and FIG. 5(b) a corresponding cross-sectional view along line X-X of a structure in which a gate stack 120 is formed over a region of active material 114 such that a portion of each of a pair of opposed sidewalls 120a, 120b of the gate stack overlie the active region 114.

Figure 6:
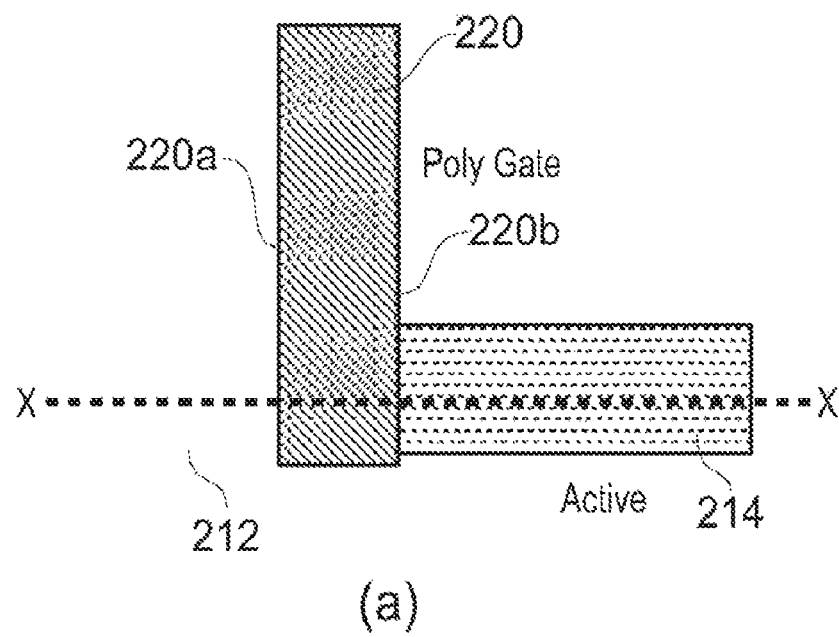
FIG. 6 is a schematic illustration of a structure formed during fabrication of a SRAM cell according to an embodiment of the invention showing (a) a plan view and (b) a cross-sectional view of the structure.
Figure 6:
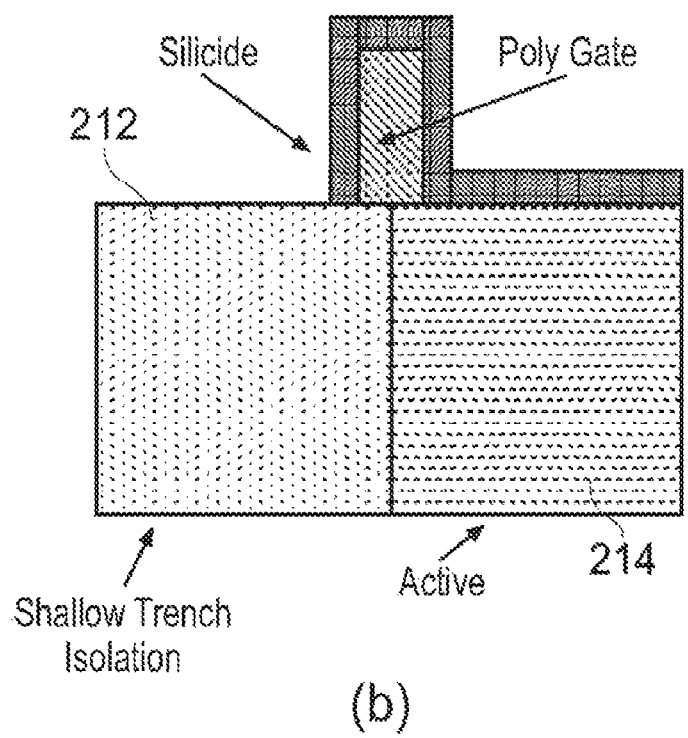

FIG. 6(a) shows a plan view, and FIG. 6(b) a corresponding cross-sectional view along line X-X of a structure according to a further embodiment of the invention in which a gate stack 220 is formed over an active region 214 and STI region 212 such that a portion of one of a pair of opposed sidewalls 220b of the gate stack 220 overlies active region 214 whilst the other sidewall 220a overlies STI region 212.

Figure 7:
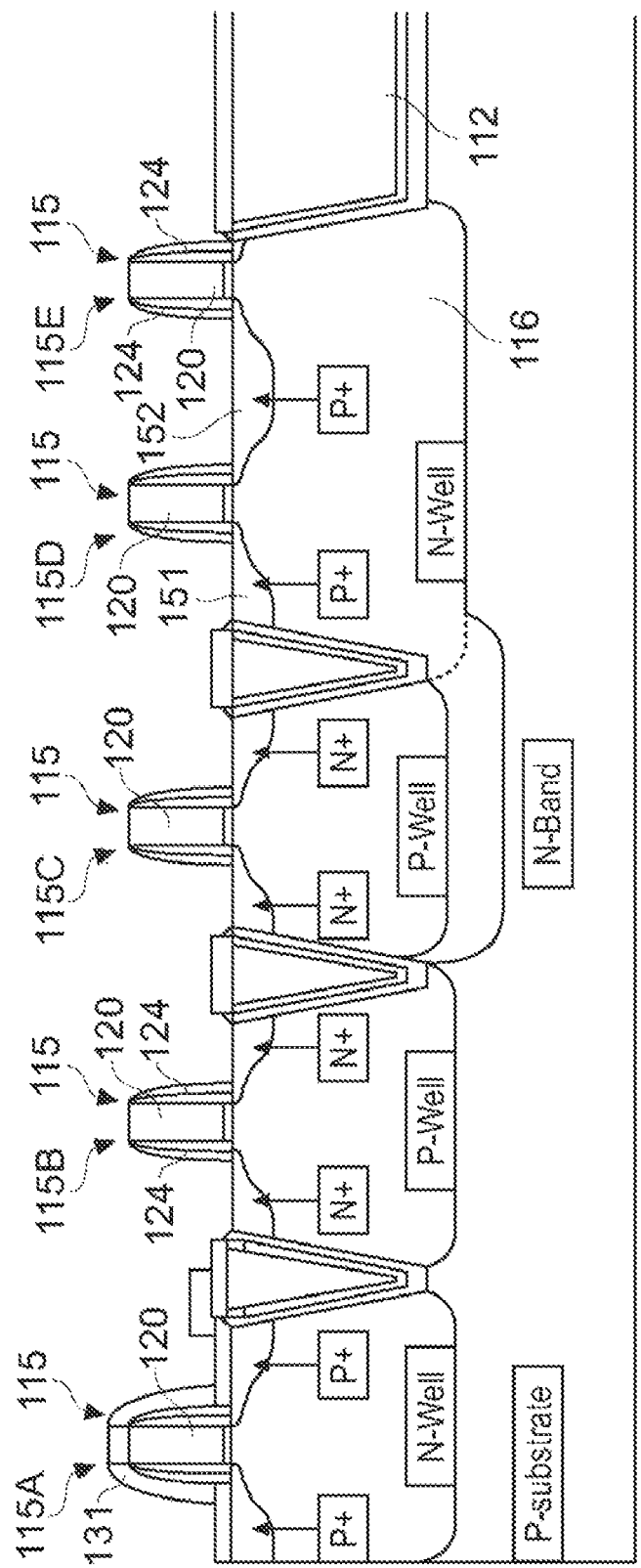
FIGS. 7 to 12 show structures formed during a process of fabricating a SRAM cell according to an embodiment of the invention.

FIG. 7 is a cross-sectional schematic illustration of a portion of a SRAM cell according to an embodiment of the invention. In the structure shown, spacer elements have been formed on sidewalls of MOSFET devices 115. Five MOSFET devices 115A-E are shown in FIG. 7. Each of the devices has doped source and drain regions, respectively. By way of example, the source and drain regions of device 115D are indicated by reference signs 151 and 152, respectively.

In the case of the device 115D, being a P-type MOSFET (PFET) device, the source and drain regions are P+ doped regions of an N-type well region 116. Device 115A is also a P-type MOSFET, whilst devices 115B and 115C are N-type MOSFET devices.

Figure 2:
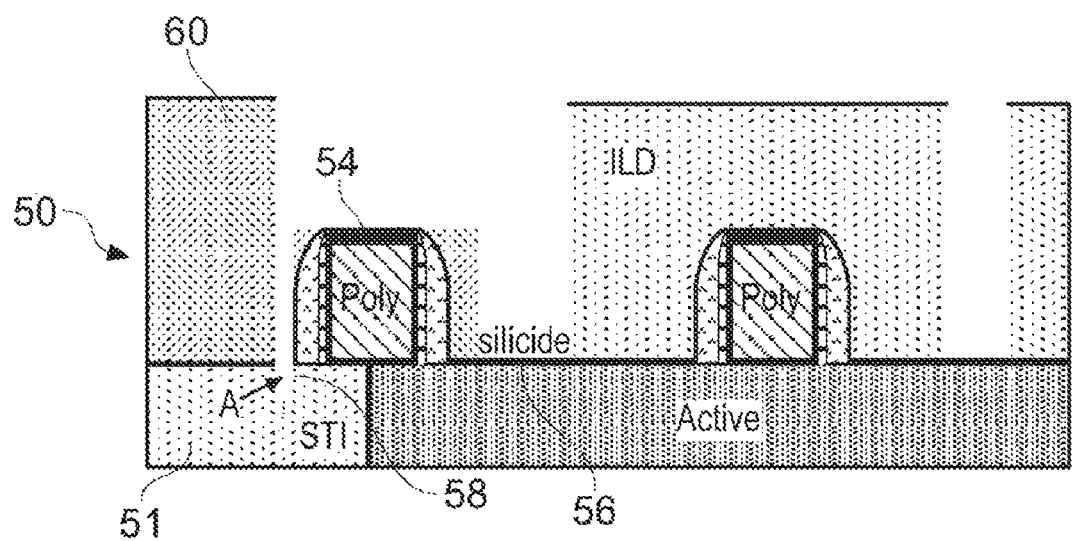
FIG. 2 is a schematic illustration of a prior art structure formed during a process of fabricating a SRAM cell.

MOSFET devices 115D and 115E of FIG. 7 correspond respectively to the two MOSFET devices illustrated schematically in the prior art structure of FIG. 2. In the structure of FIG. 7 a silicide block layer 131 is present over MOSFET device 115A, however the block layer is not present over devices 115B to 115E. In some embodiments of the invention, the silicide block layer is initially provided over each of the devices 115A to 115E, the block layer over devices 115B to 115E being removed by a process of etching using a photoresist mask.

Figure 8:
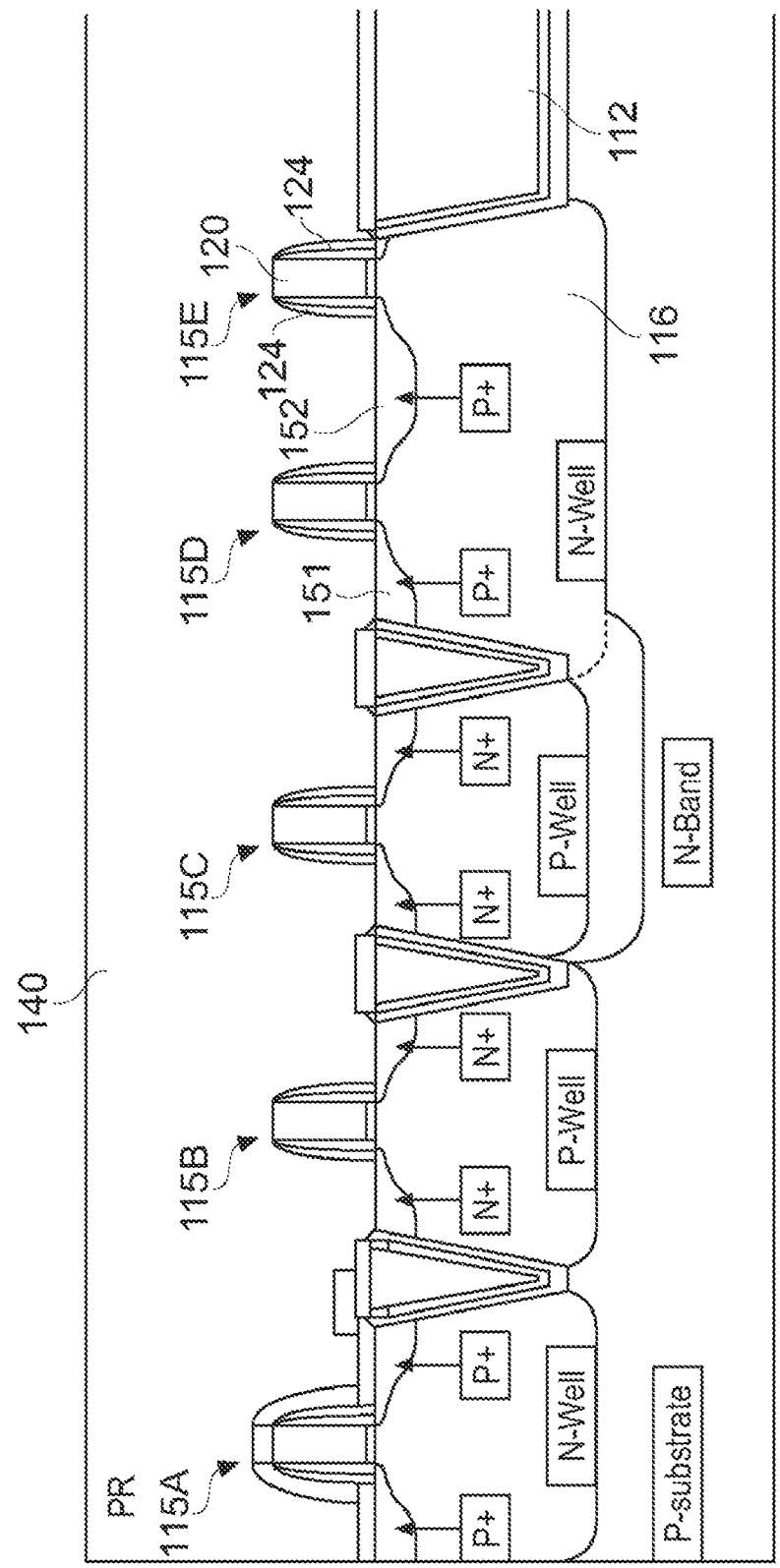

FIG. 8 shows the structure of FIG. 7 following a process of forming a layer of photoresist 140 over the structure. According to the invention, the layer of photoresist is a layer of polymethylmethacrylate (PMMA). Other layers of photoresist are also useful.

Figure 1:
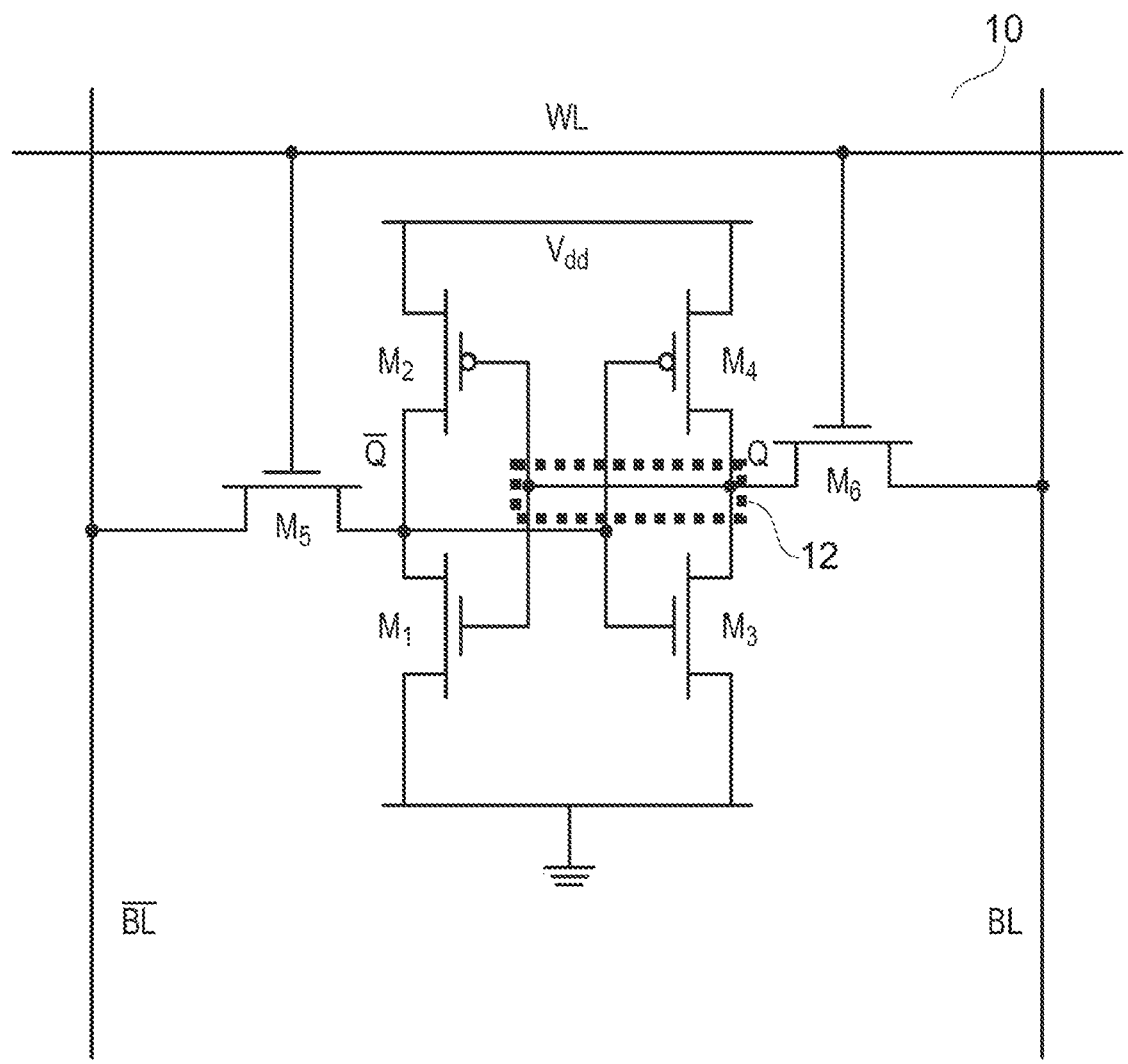
FIG. 1 is a schematic illustration of a known static random access memory (SRAM) cell.
Figure 9:
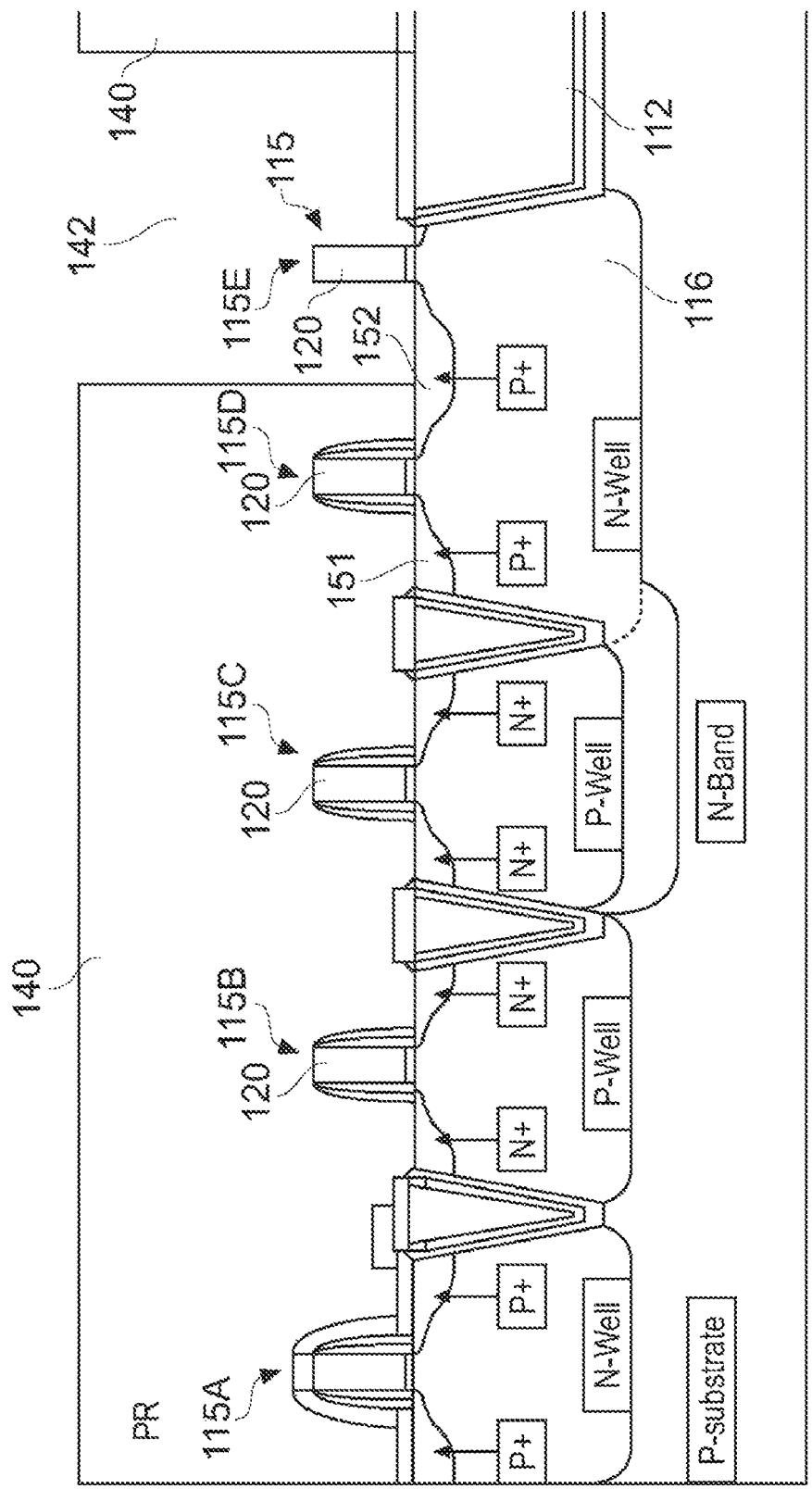

FIG. 9 shows the structure of FIG. 8 following a process of forming a window 142 in the layer of photoresist 140. Forming the window 142 exposes a region corresponding to that labelled 12 in FIG. 1, where NFET device 115E is located.

Following the process of forming the window 142, the structure is exposed to an etching process to remove spacer elements 124 from portions of sidewalls of NFET device 115E that have been exposed following formation of the window 142. For the purpose of clarification, it is noted that the window 142 exposes only a portion of a sidewall of the gate stack 120; a substantial portion of the spacer elements 124 formed over the sidewalls of the gate stack 120 remain coated with the layer of photoresist 140.

Figure 10:
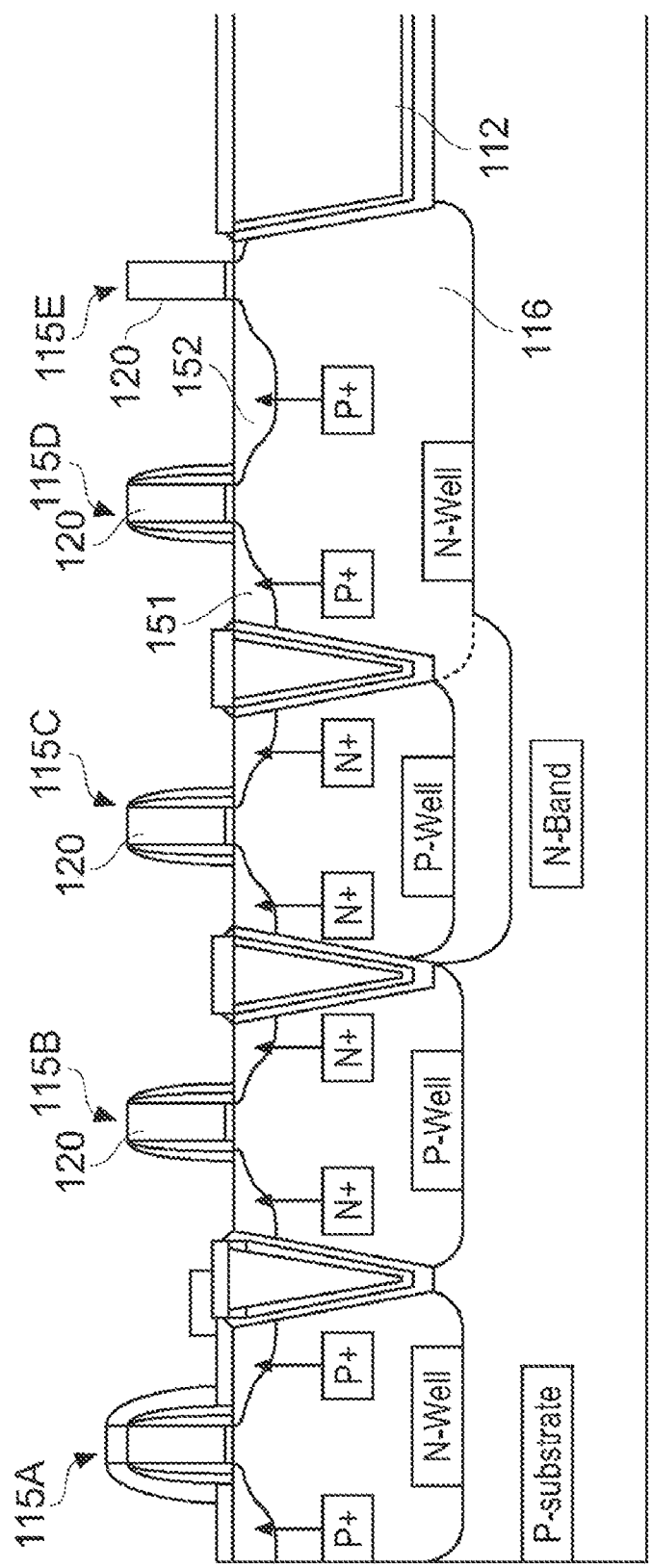

FIG. 10 shows the structure of FIG. 9 following a process of removal of the layer of photoresist 140.

Figure 11:
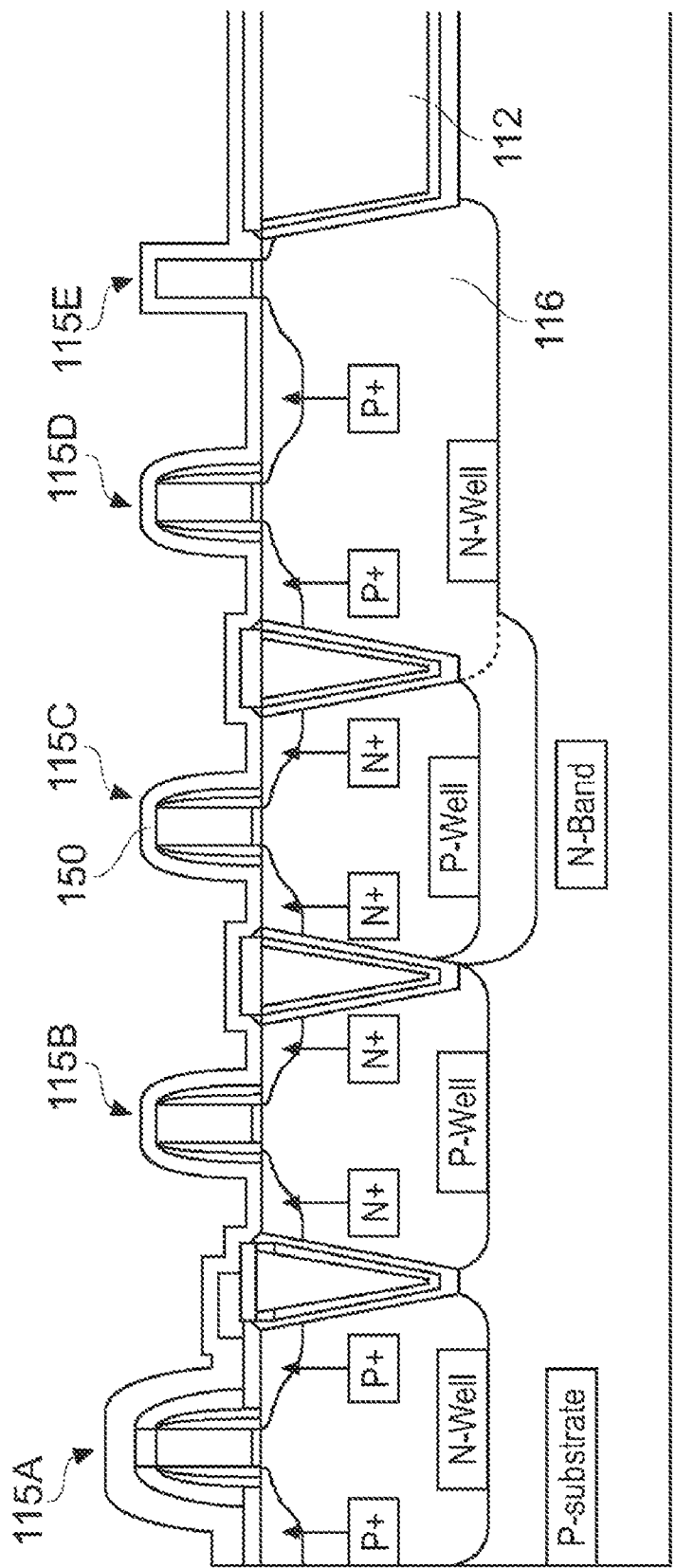

FIG. 11 shows the structure of FIG. 10 following a process of forming a layer of metal 150 over the structure.

In one embodiment of the invention, the layer of metal 150 is a layer of cobalt. Other metals are also useful. In some embodiments of the invention, the layer of metal 150 is a layer of nickel.

Figure 12:
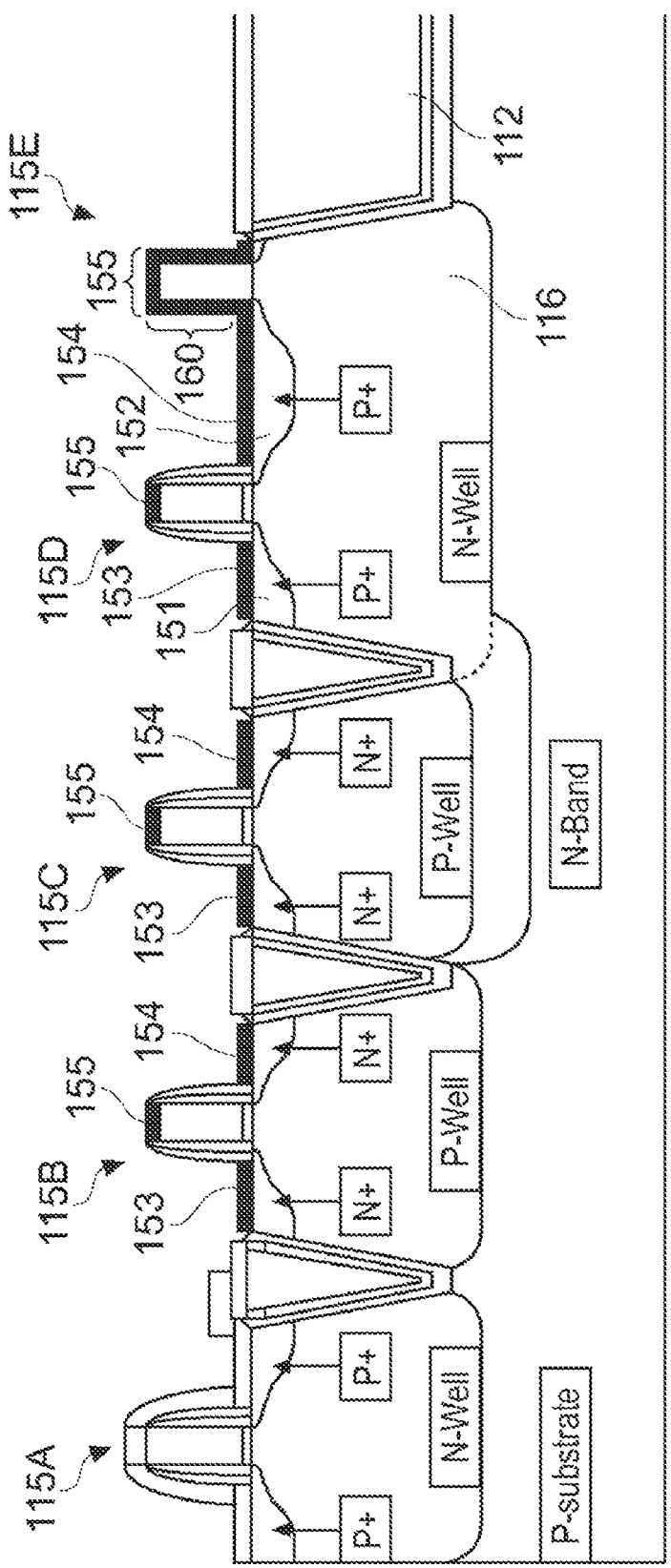

FIG. 12 shows the structure of FIG. 11 following a process of transforming portions of the layer of metal 150 to form metal silicide. Metal silicide is thereby formed over the gate stacks 120 of each of the MOSFET devices 115B-115E to form a gate contact 155 to each respective device. Metal silicide is also formed over the source and drain regions 151, 152 of each device 115B to 115E, thereby forming source and drain contact elements 153, 154, respectively. In the case of device 115E, which does not have spacer elements on a portion of the sidewalls of the gate stack 120 in the region of the structure over which window 142 was formed, silicide is formed over the sidewalls of the gate stack 120 thereby forming a strap member 160 between the gate contact 155 of MOSFET 115E and drain contact 154 of MOSFET 115D. In other words, an electrical flowpath is provided by means of the metal silicide between the gate contact 155 of MOSFET 115E and the drain contact 154 of MOSFET 115D. The flowpath is formed substantially simultaneously with the formation of source, gate and drain contacts to source, gate and drain regions, respectively, of transistor devices having exposed source, gate and drain regions exposed to the layer of metal 150.

Thus, the structure of FIG. 12 differs from that of FIG. 2 in that the strap member 160 (also known as a self-aligned silicide (salicide) strap member 160) replaces the contact strap formed in ILD layer 60 of FIG. 2. Thus, once the salicide strap member 160 has been formed there is no requirement to form any more contacts through ILD layer 60 for MOSFET 115E.

It is noted that FIG. 3 indicates that each window 110 exposes two MOSFET devices, the two devices being separated by STI region 112. Only one of these two transistors is shown in FIG. 12 (transistor 115E).

In some embodiments of the invention, only one transistor is exposed by window 110.

Figure 13:
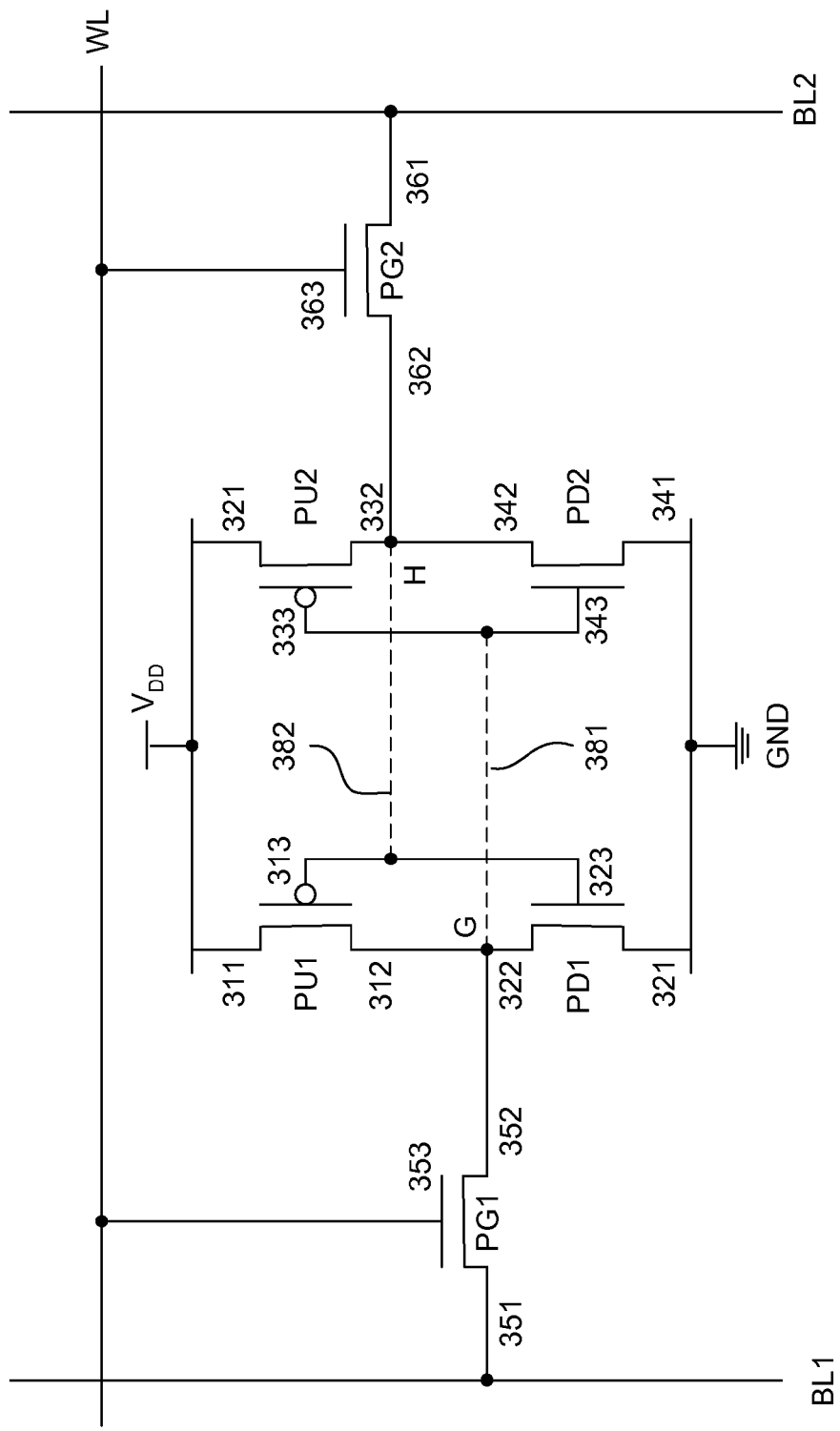
FIG. 13 shows an alternative embodiment of a SRAM cell.

FIG. 13 shows an embodiment of a SRAM cell 300. Other types of memory cells are also useful. The SRAM cell comprises six transistors PU1, PU2, PD1, PD2, PG1 and PG2. In one embodiment PU1 and PU2 comprises p-type transistors while the rest are n-type transistors. Providing other configuration of transistor is also useful. PU1 and PD1 are coupled in series via commonly coupled second terminals 312 and 322; PU2 and PD2 are coupled in series via commonly coupled second terminals 332 and 342. First terminals 311 and 321 of PU1 and PU2 are commonly coupled to a first power supply. The first power supply, in one embodiment, comprises $V_{DD}$. Other types of power supplies are also useful. First terminals 321 and 341 of PD1 and PD2 are commonly coupled to a second power supply. In one embodiment, the second power supply comprises $V_{SS}$. Other types of power supplies are also useful.

A first terminal 351 of the first access transistor PG1 is coupled to a first bitline BL1 (bitline true or BL) while a first terminal 361 of the second access transistor PG2 is coupled to a second bitline BL2 (bitline complement or /BL). A wordline WL is coupled to the access transistors via gate terminals 353 and 363. A second terminal 352 of the first access transistor is commonly coupled to the second terminals of transistors PU1 and PD1, forming node G. A second terminal 362 of the second access transistor is commonly coupled to the second terminals of transistors PU2 and PD2 which forms node H.

Node G is commonly coupled to gates 333 and 343 of PU2 and PD2. Node H is commonly coupled to gates 313 and 323 of PU1 and PD1. In one embodiment, the coupling of Node G to gates of PU2 and PD2 and node H to gates of PU1 and PD1 is achieved with a silicide strap, as indicated by dotted lines 381 and 382.

Figure 14:
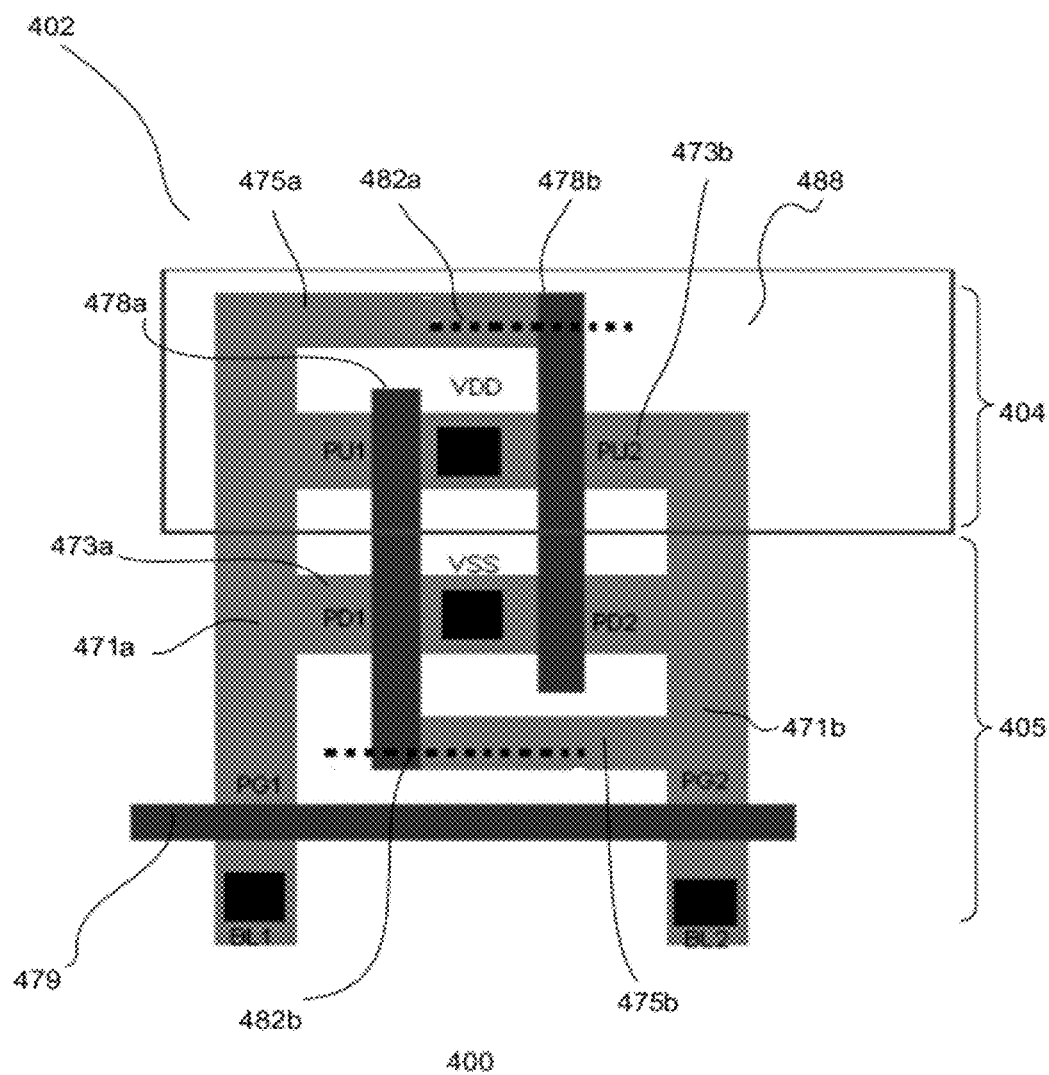
FIG. 14 shows a top view of a layout of an embodiment of a memory cell.

FIG. 14 shows a top view of a layout 402 of an embodiment of a memory cell 400. In one embodiment, the memory cell comprises a SRAM cell. Other types of memory cells are also useful. The layout comprises a cell region defined on a substrate. The substrate, for example, comprises a silicon substrate. In one embodiment, the substrate comprises a p-type lightly doped substrate. Other types of substrates, such as silicon on insulator, are also useful.

The cell region contains various transistors of the cell. For example, the cell region contains PU1, PD1, PU2, PD2, PG1 and PG2. In one embodiment PU1 and PU2 comprises first type transistors and the other transistors are second type transistors. The first type transistors are formed on a first sub-region 404 of the cell region having a doped well 488 of a second type; the second type transistors are formed on a second sub-region 405 of the cell region having a doped well of a first type. In one embodiment, the first type is p-type and the second type is n-type. Providing other configuration of transistors is also useful. The doped wells can be formed using conventional mask and implantation techniques. The different types of wells, for example, are formed by separate mask and implant processes. Other techniques for forming the doped wells are also useful.

The cell region comprises a plurality of diffusion rails. The diffusion rails correspond to source/drain diffusion regions of the transistors of the cell. The diffusion rails form active regions of the cell region. In one embodiment, first and second main rails 471a-b are provided. The main rails are disposed on the substrate along a first direction (y-direction). As shown, the main rails are parallel. Providing non-parallel mail rails may also be useful. First ends of the mail rails can be aligned while second ends are offset.

First and second full cross rails 473a-b are provided in a second direction (x-direction). The full cross rails couple the first and second main rails. First and second partial cross rails 475a-b are provided in the second direction. The first partial cross rail is coupled to the first main rail; the second partial cross rail is coupled to the second main rail. In one embodiment, the full cross rails are disposed between the partial cross rails. The first partial cross rail is coupled to the second or offset end of the first main rail while the second partial cross rail is coupled to the second main rail. Other configurations of partial and full cross rails are also useful. As shown, the cross rails are parallel. Providing non parallel cross rails are also useful.

Separating the rails are isolation regions. The isolation regions form inactive regions of the cell regions. The isolation regions, for example, comprise shallow trench isolations. Other types of isolation regions are also useful. Isolation regions also separate the cell region, for example, from other cell regions or device regions. Isolation regions can be formed by, for example, etching the substrate to form trenches and filling them with dielectric material. Excess dielectric material can be removed by, for example, polishing such as chemical mechanical polishing (CMP). Other techniques for forming the isolation regions are also useful.

First and second main gate conductors 478a-b are provided. The main gate conductors are in the first direction. In one embodiment, the first gate conductor intersects the full cross rails and the second partial cross rail; the second gate conductor intersects the full cross rails and the first partial cross rail. A cross gate conductor 479 is provided in the second direction. The cross gate conductor intersects the main rails. In one embodiment, the cross gate conductor intersects the main rails near their first ends. Other configurations of gate conductors are also useful.

The intersections of the gate conductors and cross rails generally form transistors of the memory cell. For example, the intersections of the first main gate conductor with the first and second full cross rails form PU1 and PD1 while the intersections of the second main gate conductor with the first and second full cross rails form PU2 and PD2. The intersections of the cross gate conductor with the first and second main rails form PG1 and PG2. Spacers can be provided on sidewalls of the gate conductors. The spacers, for example, facilitate formation of source/drain regions.

In one embodiment, PU1 and PU2 are located in the first sub-region of the cell region while the rest of the transistors are located in the second sub-region of the cell region. The rails or portions of the rails in the first sub-region comprise first type dopants in a second type doped well while the rails or portions of the rails in the second sub-region comprises second type dopants in a first type doped well. For example, the first partial and full cross rails and a portion of the main rails are located in the first sub-region and comprise the first type dopants and the second partial and full cross rails and a portion of the main rails are located in the second sub-region and comprise the second type dopants. In one embodiment, the first type dopants are p-type dopants for p-type transistors and the second type dopants are n-type dopants for n-type transistors.

Various techniques can be used to prepare the substrate with the transistors. For example, a semiconductor substrate can be prepared with isolation regions defining the cell region. First and second doped wells can be formed in the first and second sub-regions of the cell region. For example, a n-type doped well is formed in the first sub-region while a p-type doped well is formed in the second sub-region. Gate conductors can be formed in the cell region. This includes depositing the various gate conductor layers, such as gate dielectric, gate electrode and gate cap layers on the substrate and patterning them to form the gate conductors. Mask and etch (e.g., reactive ion etch or RIE) techniques can be employed to pattern the layers to form gate conductors. Lightly doped source/drain regions of the transistors can be formed followed by sidewall spacers on the gate conductors. Heavily doped source/drain regions and rails are formed after sidewall spacers. The source/drain regions and rails (or portions of the rails) in the first and second sub-regions can be formed using separate mask and implant processes. Other techniques for forming the transistors and rails are also useful.

In one embodiment, rail interconnects are formed over the rails. The rail interconnects, for example, comprise metal silicide. Various types of metals can be used. For example, cobalt, nickel, their alloys or a combination thereof can be used to form the metal silicide. Other types of metals are also useful. The metal silicide interconnects can be formed by depositing a metal over the substrate and heating it to cause a reaction with the silicon to form metal silicide. Excess unreacted metal can be removed, leaving the metal silicide interconnects over the rails.

Metal silicide contacts can also be formed on the surface of the gate conductor. For example, the cap layer over the gate electrode can be removed prior to forming the metal layer on the substrate. The metal layer contacts the gate electrode and reacts to form the metal silicide thereover.

The cell includes electrical straps to provide interconnections. In one embodiment, first and second electrical straps 482a-b are provided. As shown, the first electrical strap interconnects the second main gate conductor to the first partial cross rail. This forms a connection to the first main rail, which is connected to a source/drain region of PU1, PD1 and PG1. The second electrical strap interconnects the first main gate conductor to the second partial cross rail. This forms a connection to the second main rail, which is connected to a source/drain region of PU2, PD2 and PG2.

The electric strap can be formed as discussed. For example, the electrical strap can be formed with the rail interconnects. For example, prior to depositing the metal layer on the substrate, spacers and the gate cap layer at the portion of the gate conductors where the straps are formed (strap region) are removed. When the metal layer is deposited, it contacts the gate electrode. During processing, the metal reacts with the gate electrode at the strap regions and the substrate to form the electrical straps.

Contacts are provided to the cell. In one embodiment, a first contact coupled to a first power supply is provided. The first contact is provided in the diffusion region between PU1 and PU2. The first power supply, for example, is $V_{DD}$. A second contact couples the cell to a second power supply. The second contact, for example, couples $V_{SS}$ to the cell. In one embodiment, the second contact is provided between PD1 and PD2. Third and fourth contacts are provided to couple the cell to first and second bitlines BL1 and BL2. For example, the third contact couples the first main rail to the BL1 and the fourth contact couples the second main rail to BL2. The third and fourth contacts are located at about first ends of the main rails. Locating the contacts at other parts of the cell is also useful. The contacts, for example, are formed in a dielectric layer which covers the transistors and substrate.

Figure 15:
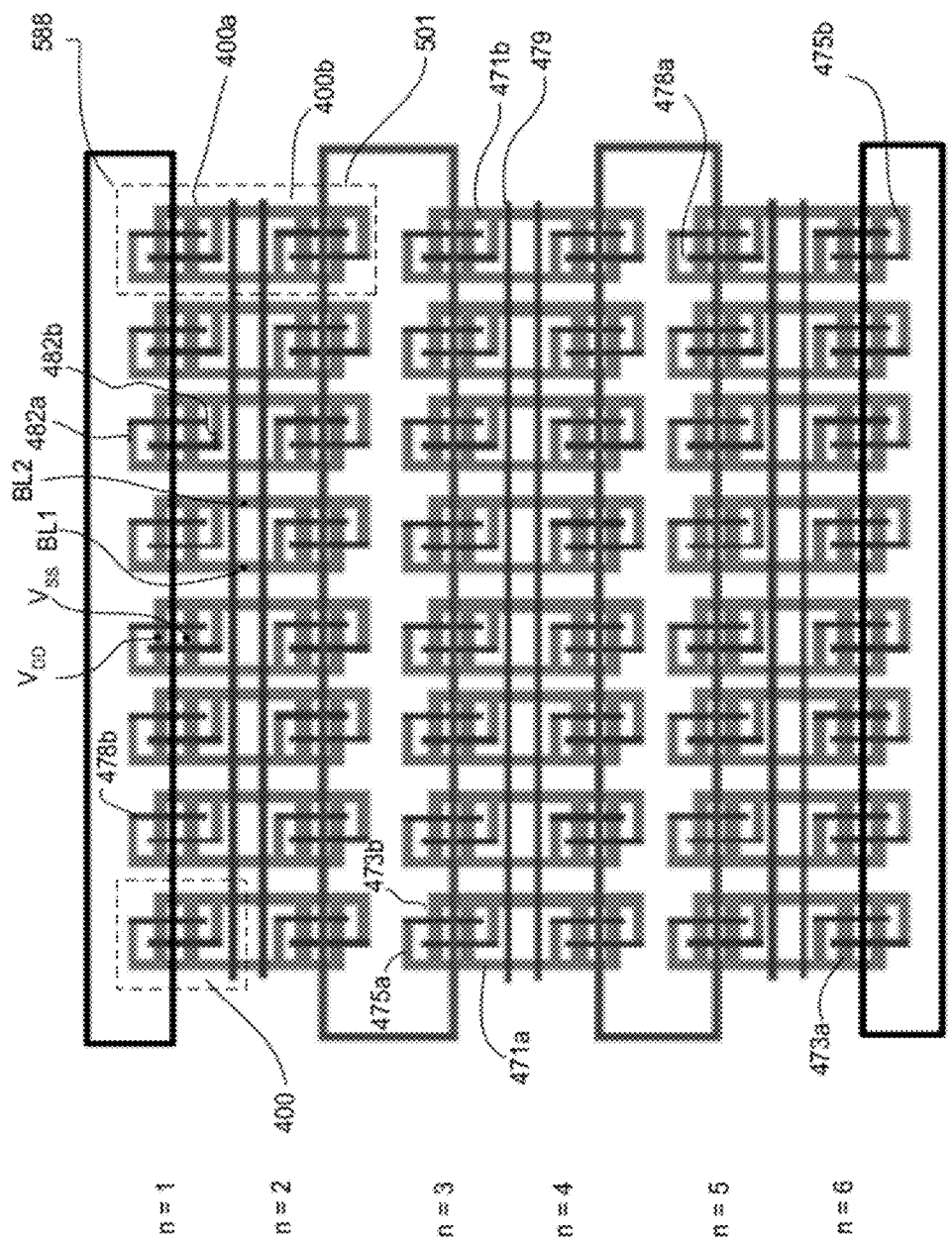
FIG. 15 shows an embodiment of a layout of a memory array.

FIG. 15 shows an embodiment of a layout of a memory array 500. In one embodiment, the memory array comprises a SRAM memory array. Other types of memory arrays are also useful. The memory cells, for example, comprise a plurality of memory cells 400 interconnected to form an array of m columns by n rows (m×n). As shown, the memory array comprises an 8×6 memory array. In one embodiment, the memory cells are interconnected by bitlines in the column direction and wordlines in the row direction. Other array sizes are also useful.

In one embodiment, a memory cell comprises a layout as described in FIG. 14. For example, a memory cell comprises main rails 471a-b, full cross rails 473a-b, partial cross rails 475a-b, main gate conductors 478a-b and a cross gate conductor 479. Additionally, contacts for $V_{DD}$, $V_{SS}$, BL1 and BL2 are provided. In one embodiment, electrical straps 482a-b are provided to couple respective main gate conductors to main rails. For example, the first main gate conductor is coupled to first main rail by the first electrical strap; the second main gate conductor is coupled to the second main rail by the second electrical strap. A memory cell is configured as part of a cell pair 501. The cell pair comprises first and second memory cells 400a-b. In one embodiment, the layouts of the cells are arranged as mirror images, with the main rails being coupled.

The memory cells are advantageously arranged to provide a doped well of a sub-region shared by adjacent cells of the same row and of an adjacent row. For example, the cells of the second and third rows share an n-type doped well 588. Likewise, the cells of the first and second rows (n=1 and 2) share a p-type doped well. Sharing of a doped well by cells of adjacent rows facilitate convenient well implants, such as simplifying implant masks.

In one embodiment, the cell layout comprises four contacts per cell, one for $V_{SS}$, $V_{DD}$, BL1 and BL2. This is a reduction from 12 contacts per cell for conventional SRAM cell layouts. Furthermore, two of the four contacts are shared by cells of a cell pair. In one embodiment, adjacent cells of a cell pair share bitline contacts (BL1 and BL2). Reducing the number of contacts per cell facilitate reduction in cell size.

It will be appreciated that in some embodiments of the invention a strap member is to be formed between a gate electrode of one MOSFET device and a source and/or a drain electrode of another MOSFET device.

It will be appreciated that embodiments of the invention are not restricted to application in SRAM device structures. Rather, embodiments of the invention are useful in a wide range of semiconductor device structures.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An integrated circuit (IC) comprising:
a substrate having at least
a first gate stack with first and second gate sidewalls and a first diffusion region adjacent to the first gate sidewall,
a second gate stack with first and second gate sidewalls and first and second diffusion regions adjacent to the first and second gate sidewalls of the second gate stack, wherein the second diffusion region of the second gate stack and the first diffusion region of the first gate stack is a common diffusion region of the first and second gate stack; and
an electrical strap, wherein the electrical strap is formed after removal of spacers from the first and second gate sidewalls of the first gate stack to form exposed first and second gate sidewalls of the first gate stack and is over and contacts the common diffusion region and exposed first and second sidewalls and top of the first gate stack, the electrical strap being arranged to provide a continuous electrical flowpath between the common diffusion region and a first gate electrode of the first gate stack.

2. The IC of claim 1 wherein the electrical strap comprises a metal silicide.

3. The IC of claim 1 wherein the first and second gate stacks are a portion of a static random access memory (SRAM) cell.

4. A memory cell comprising:
a plurality of transistors interconnected to form the memory cell, the plurality of transistors comprising first and second gate stacks; the first gate stacks having first sidewall spacers on first and second opposing first gate sidewalls, and the second gate stacks having second sidewall spacers on first and second opposing second gate sidewalls;
first diffusion regions adjacent the first opposing first gate sidewalls, and common diffusion regions between adjacent opposing first and second gate sidewalls of the first and second gate stacks; and
at least one electrical strap, the electrical strap is formed following selective removal of first sidewall spacers to expose the first and second opposing first gate sidewalls of a first gate stack while leaving the second sidewalls spacers on first and second opposing second gate sidewalls of a second gate stack; the electrical strap contacts a common diffusion region of the first and second gate stacks and exposed first and second opposing gate sidewalls and top of the first gate stack.

5. The memory cell of claim 4 comprises a static random access memory cell.

6. A memory cell comprising:
a substrate defined with first and second active regions;
a plurality of first transistors of a first type in the first active region;
a plurality of second transistors of a second type in the second active region; and
a first electrical strap, the first electrical strap is formed following selective removal of first sidewall spacers to expose the first and second opposing first gate sidewalls of a first gate stack of the plurality of first transistors while leaving the second sidewalls spacers on first and second opposing second gate sidewalls of a second gate stack of the plurality of second transistors; the electrical strap contacts a common diffusion region of first and second transistors of the plurality of first transistors and the exposed first and second gate sidewalls of the first gate stack of the first transistor of the plurality of first transistors and a top of the first gate electrode of the first gate stack of the first transistor of the plurality of first transistors.

7. The memory cell of claim 6 comprises a static random access memory cell.

8. A memory cell comprising:
a substrate defined with first and second active regions;
a plurality of first transistors of a first type in the first active region;
a plurality of second transistors of a second type in the second active region;
a first electrical strap, the first electrical strap contacts a common diffusion region of first and second transistors of the plurality of first transistors and first and second gate sidewalls of a first gate stack of the first transistor of the plurality of first transistors and a top of a first gate electrode of the first gate stack of the first transistor of the plurality of first transistors; and
a second electrical strap, the second electrical strap contacts a common diffusion region of first and second transistors of the plurality of second transistors and first and second gate sidewalls of a first gate stack of the first transistor of the plurality of second transistors and a top of a first gate electrode of the first gate stack of the first transistor of the plurality of second transistors.

9. A method of forming an integrated circuit (IC) comprising:
providing a substrate having at least
a first transistor having a first gate stack with first and second gate sidewalls, the first and second gate sidewalls comprise exposed gate sidewalls and a first diffusion region adjacent to the first exposed gate sidewall of the first gate stack, and
a second transistor having a second gate stack with first and second gate sidewalls and first and second diffusion regions adjacent to first and second gate sidewalls of the second gate stack, wherein the second diffusion region of the second transistor and the first diffusion region adjacent to the first exposed gate sidewall of the first gate stack comprises a common diffusion region of the first and second gate stacks;
removing spacers on the first and second gate sidewalls of the first gate stack to form exposed first and second gate sidewalls prior to forming an electrical strap; and
forming the electrical strap, wherein the electrical strap contacts the common diffusion region and exposed first sidewall and a top of the first gate stack to provide a continuous electrical flowpath between the common diffusion region and a first gate electrode of the first gate stack.

10. The method of claim 9 wherein forming the electrical strap comprises forming a first layer which contacts the common diffusion region and exposed gate sidewalls and top of the first gate stack.

11. The method of claim 10 wherein forming the first layer comprises:
forming an initial layer; and
transforming the initial layer to the first layer.

12. The method of claim 11 wherein transforming the initial layer to the first layer comprises heating the IC.

13. The method of claim 12 wherein the initial layer comprises a metal and the first layer comprises a metal silicide.

14. The method of claim 10 wherein forming the electrical strap simultaneously forms contacts on the first diffusion region of the second transistor and on top of the second gate stack.

15. The method of claim 9 wherein the transistors are comprised in a static random access memory (SRAM) cell.

16. The method of claim 9 further comprises forming an interlayer dielectric material over the IC.

17. The method of claim 9 wherein the gate electrode is formed from polycrystalline silicon.

18. A method of forming an integrated circuit (IC) comprising:
   providing a substrate having at least
      a first transistor having a first gate stack with first and second gate sidewalls, first spacers on the first and second gate sidewalls and a first diffusion region adjacent to the first gate sidewall of the first gate stack, and
      a second transistor having a second gate stack with first and second gate sidewalls, second spacers on the first and second gate sidewalls of the second gate stack, and first and second diffusion regions adjacent to first and second gate sidewalls of the second gate stack, wherein the second diffusion region of the second transistor and the first diffusion region adjacent to the first gate sidewall of the first gate stack comprises a common diffusion region of the first and second gate stacks;
   removing the first spacers from the first gate stack to form exposed first and second gate sidewalls of the first gate stack; and
   forming an electrical strap, wherein the electrical strap contacts the common diffusion region and exposed first sidewall and a top of the first gate stack to provide a continuous electrical flowpath between the common diffusion region and a first gate electrode of the first gate stack.

19. A method of forming a device comprising:
   providing a substrate, the substrate prepared with
      a first gate stack having first sidewall spacers on first and second opposing first gate sidewalls,
      a second gate stack having second sidewall spacers on first and second opposing second gate sidewalls,
      a first diffusion region adjacent the first opposing first gate sidewall, and
      a common diffusion region between adjacent opposing first and second gate sidewalls of the first and second gate stacks;
   selectively removing the first sidewall spacers to expose the first and second opposing first gate sidewalls while leaving the second sidewalls spacers on first and second opposing second gate sidewalls; and
   forming an electrical strap, wherein the electrical strap contacts the common diffusion region and exposed first and second opposing first gate sidewalls and top of the first gate stack.

20. The method of claim 19 wherein forming the electrical strap comprises forming a metal silicide electrical strap.

21. The method of claim 19 further comprises forming a SRAM memory cell.

* * * * *